(12) United States Patent
Engbring et al.

(10) Patent No.: US 8,058,881 B2
(45) Date of Patent: Nov. 15, 2011

(54) METHOD FOR CHECKING THE CURRENT FLOW THROUGH INDIVIDUAL WIRES OF A BRAIDED WIRE, AND APPARATUS FOR CARRYING OUT THE METHOD

(75) Inventors: Jürgen Engbring, Iphofen (DE); Matthias Ebert, Dettelbach (DE); Johann Hinken, Magdeburg (DE)

(73) Assignee: LEONI Bordnetz-Systeme GmbH, Nuremburg (DE)

( * ) Notice: Subject to any disclaimer, the term of this patent is extended or adjusted under 35 U.S.C. 154(b) by 448 days.

(21) Appl. No.: 12/404,467

(22) Filed: Mar. 16, 2009

(65) Prior Publication Data
US 2009/0219031 A1 Sep. 3, 2009

Related U.S. Application Data

(63) Continuation of application No. PCT/EP2008/004985, filed on Jun. 20, 2008.

(30) Foreign Application Priority Data

Jun. 23, 2007 (DE) .......................... 10 2007 028 965

(51) Int. Cl.
*G01R 31/08* (2006.01)
*H04B 3/46* (2006.01)

(52) U.S. Cl. ...... 324/529; 324/512; 324/539; 324/117 R
(58) Field of Classification Search .................. 324/529, 324/713, 539, 543, 117 R
See application file for complete search history.

(56) References Cited

U.S. PATENT DOCUMENTS

| 1,523,398 | A | | 1/1925 | Ceccarini |
| 4,754,218 | A | * | 6/1988 | Wagner et al. ................. 324/127 |
| 5,834,931 | A | * | 11/1998 | Moore et al. ..................... 324/95 |
| 7,279,654 | B2 | * | 10/2007 | Ennis et al. ............... 219/121.48 |
| 2002/0079905 | A1 | * | 6/2002 | Brown ........................... 324/543 |

FOREIGN PATENT DOCUMENTS

| GB | 1 542 933 A | 3/1979 |
| JP | 2005-20813 A | 1/2005 |
| JP | 2005274351 A | 10/2005 |
| LU | 85155 | 9/1985 |

OTHER PUBLICATIONS

Weinstock et al., "Nondestructive Evaluation of Wires Using High-Temperature SQUIDs", IEEE Transactions on Applied Superconductivity, vol. 9, No. 2, Jun. 1999, pp. 3797-3600.
German Office Action dated May 16, 2008.
International Search Report, dated Nov. 5, 2008.

* cited by examiner

*Primary Examiner* — Vincent Q Nguyen
(74) *Attorney, Agent, or Firm* — Laurence A. Greenberg; Werner H. Stemer; Ralph E. Locher

(57) ABSTRACT

In order to make it possible to detect a fault location, safely, reliably and with a high response sensitivity, in a braided wire which has a plurality of individual wires, an electric current is passed through the braided wire and the magnetic field which is formed as a result of the braided wire through which current flows is detected by a sensor and is evaluated. A fault location is deduced if the measured magnetic field has an oscillation whose length is a multiple of a lay length of the braided wire, and in particular corresponds to the lay length. The method is also used in particular for non-destructive testing of the quality of a contact connection of a contact element to the braided wire.

17 Claims, 2 Drawing Sheets

METHOD FOR CHECKING THE CURRENT FLOW THROUGH INDIVIDUAL WIRES OF A BRAIDED WIRE, AND APPARATUS FOR CARRYING OUT THE METHOD

CROSS-REFERENCE TO RELATED APPLICATION

This is a continuation, under 35 U.S.C. §120, of copending international application No. PCT/EP2008/004985, filed Jun. 20, 2008, which designated the United States; this application also claims the priority, under 35 U.S.C. § 119, of German patent application No. DE 10 2007 028 965.2, filed Jun. 23, 2007; the prior applications are herewith incorporated by reference in their entirety.

BACKGROUND OF THE INVENTION

Field of the Invention

The invention relates to a method for checking the current flow through individual wires of a braided wire, in which the individual wires are twisted with one another with a lay length, with an electric current being passed through the braided wire and with the magnetic field which is formed as a result of the braided wire through which current flows being detected by a sensor and being evaluated. The invention also relates to an apparatus for carrying out the method.

The method is used for non-destructive testing of a braided wire for fault locations, specifically and in particular for checking for torn individual wires. Japanese patent application JP 2005 020813A discloses a method for checking a braided wire in which a magnetic field which is formed around the braided wire is detected with the aid of a plurality of sensors which are arranged around the braided wire. In this case, the intensity distribution of the magnetic field is evaluated. If there is a decrease in magnetic field intensity in one area, then a fault location is deduced at this location, in the form of a torn individual wire A method such as this, in which the magnetic field is evaluated, is more sensitive than measurements in which the electrical field is evaluated (capacitive measurement). However, the changes in the magnetic field caused by a torn wire are small, and therefore a measurement and evaluation arrangement of high sensitivity is required in order to obtain results which are as reliable as possible.

SUMMARY OF THE INVENTION

It is accordingly an object of the invention to provide a method for checking the current flow through individual wires of a braided wire, and an apparatus for carrying out the method, which overcomes the above-mentioned disadvantages of the heretofore-known devices and methods of this general type, which allows simple checking, which is safe and reliable, of a braided wire for a fault location.

With the foregoing and other objects in view there is provided, in accordance with the invention, a method for checking a current flow through individual wires of a braided wire, the individual wires being twisted with one another with a lay length. The method includes the steps of passing an electric current through the braided wire, detecting a magnetic field being formed as a result of the braided wire through which the electric current flows via a sensor, and evaluating the magnetic field and deducing a fault location if a measured magnetic field has a characteristic oscillation having a length being a multiple of the lay length and in particular corresponds to the lay length.

In order to evaluate whether a fault location, in particular a torn individual wire of the braided wire, is present, the invention in this case provides that a fault location is deduced if the measured magnetic field has an oscillation whose length is a multiple of the so-called lay length of the braided wire. In particular, a fault location is deduced if the oscillation of the magnetic field corresponds to the lay length. The measurement is in this case in particular based on the braided wire and the sensor, by which the magnetic field is detected, being moved relative to one another. The strength of the magnetic field, which is dependent on the location along the length of the braided wire, is detected on the basis of this relative movement.

Investigations have now shown that, in the area of a fault location, the magnetic field changes in a characteristic manner as a function of the location in the longitudinal direction of the braided wire, and has a characteristic oscillation length. The oscillation length corresponds in particular to the lay length of the braided wire. The characteristic oscillation is therefore used for evaluation, in order to make it possible to deduce a fault location reliably and clearly. Further disturbance effects, which can likewise lead to a variation of the magnetic field, such as minor variations in the distance between the braided wire and the sensor resulting from bending of the braided wire, are eliminated in this case. To this extent, this method has better evaluation accuracy than an evaluation which is directed only at the evaluation of the amplitude of the measured field. In addition, the overshooting of the defined threshold value of the amplitude of the magnetic field is preferably also used as a further criterion for deducing the fault location.

The expression lay length in this case means the length which corresponds to the distance that the respectively twisted individual wire requires in the longitudinal direction of the braided wire to rotate through 360° as a result of its twisting. In the case of electrical braided wires which are used as electrically conductive cables, and which, for example, have from a small number up to several tens of individual wires, the lay length is a few centimeters. In the case of a copper braided wire with 7 to 19 individual wires with an individual wire diameter in the region of 0.2 mm, the lay length is normally about 15 to 40 mm, in particular about 20 mm.

The characteristic oscillation can be explained as follows: during the measurement, current flows through the braided wire. As a result of their twisting, the individual wires run essentially on helical lines. The current is therefore transported primarily in the form of a helical line in the longitudinal direction of the individual wires. Since the individual wires are normally not insulated from one another, it is also possible for the current that is fed in to be able to flow from one individual wire to the others, transversely with respect to the individual wires. However, the contact resistance is considerably higher than that in the longitudinal direction of the individual wire, as a result of which no current flow normally occurs in the lateral direction.

The sum of the currents in the individual wires of a braided wire corresponds to the total current flow in the longitudinal direction of the braided wire, and the current conduction in the form of a helical line through the individual wires is at least largely eliminated by superimposition in the overall current flow, as a result of which the current flows essentially in the longitudinal direction of the braided wire. This presupposes that a current of the same magnitude is fed into all the individual wires and that the current flows uniformly and without any interruption in all the individual wires.

If the current flow in one individual wire is now interrupted, for example by an individual wire being torn, this results in the need for current to flow in the lateral direction from one individual wire to another. This leads to an inhomogeneity in the overall current flow in the area of a fault location such as this. A uniform overall current flow occurs again only at a certain distance from the fault location. Investigations have now shown that a current in the form of a helical line is formed in the area of this fault location, in which the current must flow inhomogeneously through the overall cross section of the braided wire, as a result of which the magnetic field which surrounds the conductor does not run in a uniform manner but oscillates at a fixed ratio to the lay length of the braided wire. In particular, the magnetic field oscillates with the lay length of the braided wire in this inhomogeneous area.

The quality of a contact connection of a contact element to a braided wire is preferably checked by once again passing an electric current through the braided wire. In order to check the quality of the contact connection, the magnetic filter formed is now detected by the sensor at a distance from the contact connection, and is evaluated. A fault location at the contact connection is deduced on the basis of the magnetic field, which is measured at a distance from the contact connection, for example if the magnetic field has a characteristic discrepancy from a reference signal or comparison signal, for example an amplitude which exceeds a threshold value and/or a characteristic profile, specifically an oscillation with a length which in particular corresponds to the lay length of the braided wire.

This method therefore makes it possible to check a contact connection very sensitively and without any disturbances to determine whether there is an equally good contact with all the individual wires in the braided wire or whether individual braided wires are not involved, or are involved only to a small extent, in the current flow in the contact connection.

This embodiment variant of the method is also based on the knowledge that, if the current flow through one individual wire is interrupted, a proportion of the current must flow in the lateral direction from one individual wire to the other individual wire as a result of a lack of contact with the contact element, and that the magnetic field will thus be disturbed, and will have an inhomogeneity, in a certain area over the length of the braided wire. In particular, the magnetic field has the characteristic oscillation length. Thus, overall, in this variant, use is made of a remote effect from the defect location, with the result that this fault location can still be identified even at a distance from the actual fault location, specifically from the interruption of the current flow through the individual wire resulting from a lack of contact in the contact area. Even in the case of extrusion-coated contact connections, as are normally used nowadays in prefabricated cable harnesses, the contact connection can therefore be checked non-destructively.

Both variants are therefore based on the same idea that, specifically, in the event of an interruption in the current flow through one individual wire, the current must actually flow in the lateral direction at a distance from the fault location, thus leading to characteristic discrepancies in the detected magnetic field.

In one expedient development, the remote effect is used in order to deduce a fault location. Measurements are expediently carried out in this case at a distance in the range from 2 to 10 times the lay length from the fault location. Particularly when checking a contact connection, this makes it possible to additionally carry out a safe and reliable evaluation in a remote area.

The characteristic oscillation with the oscillation length corresponding to the lay length indicates a certain spatial propagation by virtue of the remote effect. The characteristic oscillation therefore extends over a certain distance on both sides of the actual fault location. That point on the braided wire which corresponds to the spatial center of the characteristic oscillation, that is to say the center of the spatial propagation, is thus expediently identified as the fault location. Alternatively, that point on the braided wire at which the oscillating magnetic field has the greatest amplitude is localized as the fault location.

According to one expedient development, a gradient of the magnetic field is detected in order to achieve as high sensitivity as possible. In particular, a so-called gradiometer is used as a sensor for this purpose. A gradiometer such as this is a single unit which is able to detect magnetic field changes in one or more spatial directions. One example of this is so-called squid gradiometers, as described by way of example in German patent DE 103 04 225 B4. Alternatively, a type of bridge circuit containing a plurality of individual magnetic sensors can also be combined to form a physical unit, in order to form the gradiometer. In this case, by way of example, the individual sensors are Hall sensors or else magnetoresistive sensors which are each in the form of semiconductor components. The use of a gradiometer effectively filters out the influences of essentially homogeneous background magnetic fields, for example the earth's magnetic field, so that only the disturbance signal caused by the fault location is detected.

In the method, a current in the ampere region for example of about 1 A is passed through the braided wire, such that the resultant magnetic field has a strength which is only about two to three times the earth's magnetic field, that is to say it is approximately of the same order of magnitude as the earth's magnetic field.

In order to achieve a configuration which is as simple as possible, the magnetic field is expediently detected by just one sensor, in particular with the aid of just one gradiometer. Because of the special evaluation technique, specifically the evaluation of the oscillation length, there is no need to arrange a multiplicity of sensors around the braided wire.

In one alternative expedient development, a plurality of sensors is used, and, for example, are arranged offset with respect to one another in the circumferential direction. This makes it possible to determine magnetic field strengths which differ as a function of the location, and to determine gradients as well.

A target signal is expediently formed by calculation from the individual signals which are produced via the sensors in this case, in which target signal disturbance effects which are not caused at the fault location have already been filtered out. In particular, this makes it possible to eliminate noise effects. Magnetic field fluctuations which are caused by the twisting of the individual wires are preferably eliminated by a suitable addition of the individual signals, for example addition of the individual signals with the correct phase and amplitude. In particular, this results in changes in the magnetic field being detected in three independent spatial directions. These spatial directions are preferably the longitudinal direction of the braided wire, its circumferential direction and the radial direction.

In addition, when using a plurality of sensors, it is also possible to determine a centroid position of the current flowing through the braided wire and in this case to check whether the current distribution within the braided wire is homogeneous.

The method preferably provides for direct current to be applied to the braided wire. In order to increase and improve the sensitivity, one expedient development additionally provides for an alternating-current component to be modulated onto this. In principle, it is also possible to apply exclusively alternating current to the braided wire. Modulation with an alternating-current component in the form of a lock-in technique increases the sensitivity and accuracy. The lock-in technique is a type of phase-dependent filtering since the only signal parts which are evaluated are those which have a predetermined phase offset with respect to the applied alternating-current component, or have the same phase as the applied alternating current.

In order to ensure safe, reliable detection, one expedient development provides for the braided wire possibly to be moved in addition to its relative movement with respect to the sensor, and alternatively or additionally for a force to be exerted on it. The movement or the force influence is in this case chosen such that the fault location and thus the magnetic field are varied. This refinement is based on the idea that, in poor circumstances, there is a good contact in the longitudinal direction of an individual wire, despite that individual wire being torn, as a result of which there is virtually no inhomogeneity in the measured magnetic field. The movement of the entire braided wire or else the influence of force places a mechanical load on the fault location, thus increasing the probability that the fault location will also be clearly noticeable in the magnetic field. For this purpose, by way of example, vibration is exerted on the braided wire, or the braided wire is subjected to a mechanical alternating force, continuously during the measurement, with this alternating force acting, for example, in the longitudinal direction or else in the lateral direction of the braided wire. Alternatively, it is also possible to carry out two measurement runs and to move the braided wire or to exert a force on it between the measurement runs.

The method is expediently used in order to check an electrical cable for, for example, a possible torn braid. In particular, the method is used to check the electrical contact connection of a cable, since this is critically related to a contact resistance which is as low as possible.

Provision is alternatively made for the method to be used to check mechanical supporting cables which, in their field of application, are themselves no longer intended to carry current. Supporting cables such as these are used, for example, in elevators, cranes, cable cars, bridges, in which the supporting cables are generally subjected to dynamic or static tensile loading.

The method can in this case optionally be carried out at a test center or else in-situ with the aid of a mobile test arrangement, for example on an installed supporting cable.

In all the fields of application, it is in this case advantageous for the braided wires to be composed of non-magnetic materials, in particular materials which cannot be magnetized. In principle, however, the method is also suitable for magnetic materials. When electrical cables are being checked, these are, in particular, copper or aluminum braided wires.

The described method is used in particular for quality control for braided wires such as these. The method is preferably used for quality control for the fabrication of cable harnesses, for example for the motor vehicle field. In this case, in particular, the contacts with knock-on contact elements, and in some cases extrusion-coated contact elements, are also checked. Contact elements such as these are, for example, plug connectors which are connected to the respective braided wire via a soldered, welded and/or crimped contact. Terminal contacts or insulation-displacement contacts can also be provided.

In one preferred refinement, the work is carried out with only one or at most with a small number of sensors, which are moved relative to the braided wire. As an alterative to this, a static measurement is envisaged, in which sensors are fitted distributed at a plurality of points over the length of the braided wire.

In further refinements, it is possible for the braided wires to have a radio frequency applied to them, such that they have a specific radiated emission characteristic, in the form of antennas. In this case, it is possible to evaluate a change in the radiated emission characteristic resulting from a fault location. A check such as this is particularly suitable for those braided wires which are intended to be used as antenna structures and/or transmitter structures in the subsequent field of use, and to which radio frequency is applied. Furthermore, in addition to the magnetic field measurement, it is also possible to detect the electrical field, with the aid of a capacitive measurement, and to evaluate this.

One alternative application expediently provides for the actual lay length to be deduced from the measured signal, which is to say for this lay length to be measured by evaluation of the magnetic field. For this purpose, the variation of the magnetic field, which has been described above as a noise effect, resulting from the twisting of the individual wires is evaluated.

Other features which are considered as characteristic for the invention are set forth in the appended claims.

Although the invention is illustrated and described herein as embodied in a method for checking the current flow through individual wires of a braided wire, and an apparatus for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
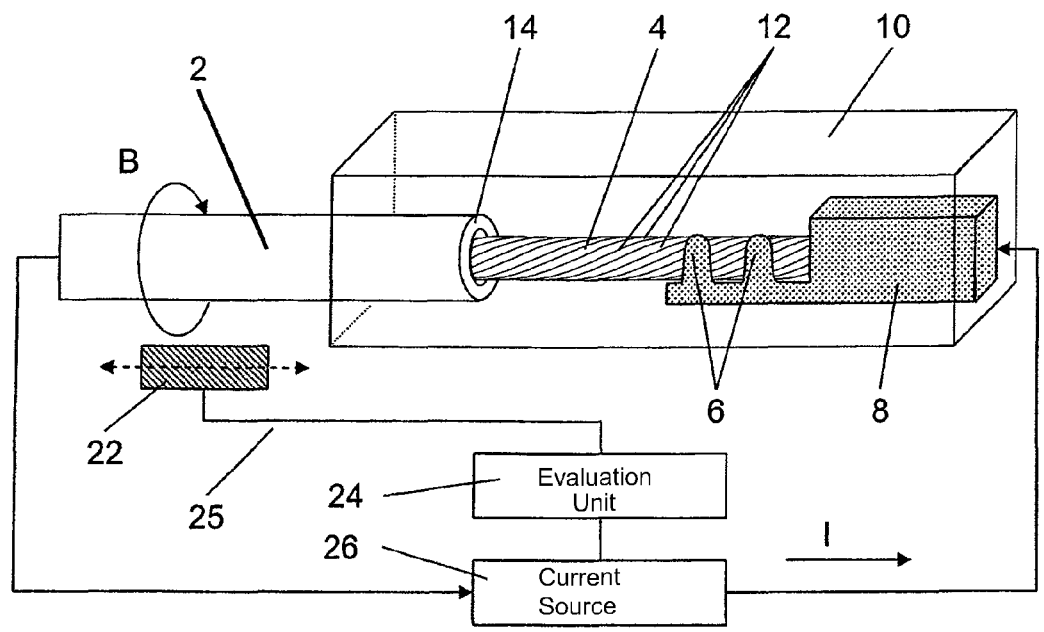
FIG. 1 is a diagrammatic, perspective, exploded view of a contact connection in an area of a crimp sleeve and a stripped end area of an electrical cable with a magnetic field sensor and measurement configuration according to the invention.

Parts having the same effect are provided with the same reference symbols in the figures. Referring now to the figures of the drawing in detail and first, particularly, to FIG. 1 thereof, there is shown, in the form of an exploded illustration, an electrical cable 2 which has been stripped at the end such that its electrical conductor, a braided wire 4, is exposed at the end for a contact connection 6 to a contact element 8 which, in the exemplary embodiment, is in the form of a crimp sleeve. The cable 2 and the contact element 8 are surrounded by a sheath 10 in the area of the contact connection 6. In particular, the contact element 8 and the cable 2 are extrusion-coded.

The braided wire 4 contains a multiplicity of individual wires 12 which are twisted with one another. In particular, the individual wires 12 are uninsulated individual copper wires with an individual wire diameter in the range between 0.1 and 0.25 mm. By way of example, between seven and thirty individual wires 12 are twisted with one another in the exemplary embodiment. The braided wire 4 itself is surrounded by insulation 14, thus forming the electrical cable 2.

FIG. 1 furthermore illustrates a magnetic sensor 22, which, in particular, is in the form of a gradiometer. In addition, but illustrated only schematically, an evaluation unit 24 is shown, which is connected to the sensor 22 via a signal line 25. Furthermore, a current source 26 is provided, and is connected to the contact element 8 on the one hand and to the braided wire 4 on the other hand, in order to feed in current I. The evaluation unit 24 is also connected to the current source 26 and drives it. In the exemplary embodiment, the current source 26 is in particular in the form of a direct-current source, although an alternating-current component can also be modulated onto this.

Figure 2:
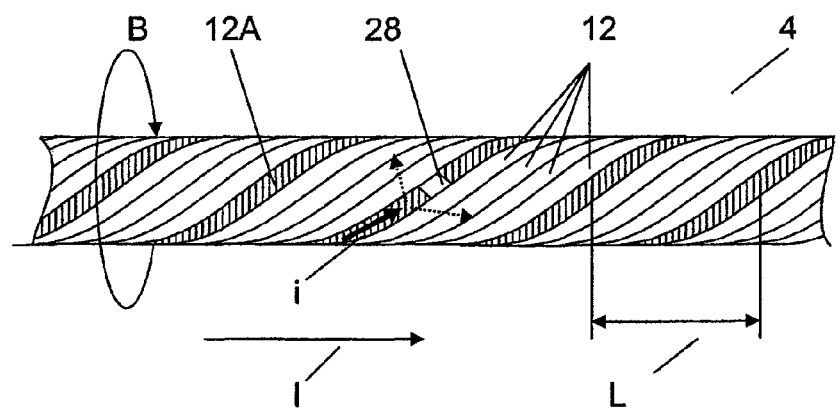
FIG. 2 is a diagrammatic, side view of a braided wire.

The twisting of the individual wires 12 can be seen particularly from the braided wire 4 which is illustrated in FIG. 2. The braided wire 4 shown in FIG. 2 is, for example, just a mechanical supporting cable without any further electrical functionality, or else a conductor for a cable 2. In order to illustrate the twisting, one individual wire 12A is in this case emphasized by gray shading. Overall, the individual wires 12 are twisted with one another with a so-called lay length L. In this case, the lay length L is defined as the length required for the respective individual wire 12 to revolve through 360°. The lay length L is normally between 15 mm and 40 mm for electrical cables 2 which are configured for currents in the region of a number of amperes.

The braided wire 4 is checked for a possible fault location 28 by the method described in the following text. In this case, a single-wire tear, for example in the center of the braided wire 4 or at any other point is understood to be a fault location 28, as is indicated in FIG. 2. On the other hand however, a defective contact connection between the stripped end of the braided wire 4 and the contact element 8 may also be understood to be a fault location 28, that is to say when individual wires 12 are not involved in the electrical contact that is made with the contact element 8, as a result of which no current, or only a very small current, flows into the contact element 8 through these individual wires 12.

Figure 3:
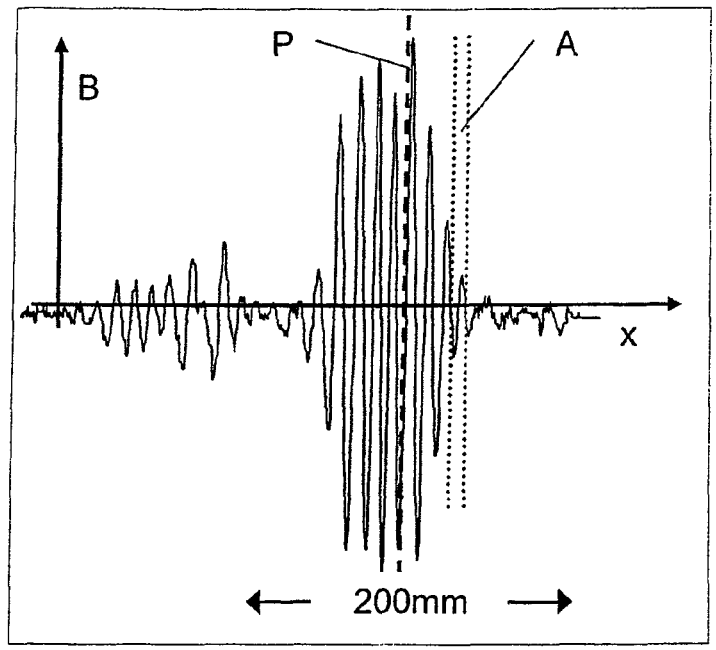
FIG. 3 is a characteristic signal profile of a measured magnetic field in an area of a fault location.

The method is therefore used to check the current flow through the individual wires 12. If there is no fault location 28 and if a partial current i of the same strength is fed into each of the individual wires 12, the propagation direction of the partial current is in the longitudinal direction of the individual wires 12 (see FIG. 2). Because of their twisting, the respective partial currents i propagate along an approximately helical line. The superimposition of the partial currents results in a virtually ideal overall current I in the longitudinal direction of the braided wire 4, thus resulting in a largely homogeneous magnetic field, corresponding to the magnetic field B of one conductor through which a current flows. The twisting results in a certain disturbance signal or noise. FIG. 3 illustrates one example of a signal profile. In the illustrated diagram, the magnetic field B is plotted against the location x (longitudinal extent of the braided wire 4).

If there is a fault location 28, that is to say if the current flow through an individual wire 12 is interrupted, the partial current i flowing through this individual wire 12 must escape to the other individual wires 12, as is illustrated by the dotted arrows in FIG. 2. In the area of the fault location 28, this results in a disturbance in the current flow and thus a disturbance in the magnetic field B, which is detected. Because of the braiding of the individual wires 12 with the lay length L, the inhomogeneity of the current flow and therefore that of the magnetic field B as well have a characteristic oscillation. The magnetic field B oscillates in the area of the fault location 28 with the lay length L.

The sensor 22 is used to detect the magnetic field signal. In this case, the sensor 22 is moved relative to the cable 2, in the direction of the arrow along the cable 2. In this case, both the sensor 22 and the braided wire 4 may be moved. The sensor signal that is detected is transmitted to the evaluation unit 24, in which the sensor signal is then evaluated. If an electrical alternating-current component is modulated onto the direct current, then the evaluation unit 24 compares the phase of the measurement signal received by the sensor 22 with the modulated alternating-current component, in the form of a lock-in technique.

The typical example, as illustrated in FIG. 3, of a signal profile of the magnetic field B measured as a function of position results in the area of a fault location 28.

As can clearly be seen, in the region of the fault location 28, the measured signal exhibits a considerable change in comparison to the rest of the profile. To be precise, the signal shows a considerable oscillation in the region of the fault location 28, which oscillation has a specific oscillation length A, which corresponds to the lay length L.

The annotated position P in the signal corresponds to the position of the fault location 28 in the braided wire 4. The position P is located at the physical center of the characteristic oscillation. The expression characteristic oscillation means that signal area in which the signal oscillates with the characteristic oscillation length A.

The existence of a fault location 28 is now deduced exclusively when the oscillation has the oscillation length A which corresponds to the lay length L. The overshooting of a specific amplitude is preferably used as a further criterion, in order to make it possible to ignore noise signals.

In order to obtain a sensitivity that is as high as possible, the sensor 22 is preferably in the form of a gradiometer, that is to say detecting a position-dependent magnetic field change, for example in the radial direction with respect to the braided wire 4.

As can be seen from FIG. 3, the fault location 28 (position P) has a considerable remote effect, that is to say the fault location 28 acts on the magnetic field B over a considerable length, which corresponds to a multiple of the lay length L. In particular, in the region of the fault location 28, the characteristic signal overall has a length of about 10 cm in the exemplary embodiment. This remote effect means that it is possible to carry out a check of the current flow through the respective individual wire 12 even at a distance from the actual fault location 28. This allows expedient and safe evaluation of the contact connection of the contact element 8 to the braided wire 4, as is illustrated in FIG. 1.

The signal exhibits noise or a disturbance signal around the fault location 28 on both sides of the characteristic areas. This can be largely suppressed by, for example, arranging a plurality of sensors 22, for example two or three sensors, distributed around the braided wire 4, and by moving these sensors 22 jointly along the braided wire 4. A non-illustrated resultant target or overall signal is formed from the individual signals detected in this way. The disturbance signal can be reduced considerably by suitable phase shifting and superimposition of the individual signals. This is because the disturbance signal is caused at least partially by the twisting of the individual wires 12, as a result of which an inhomogeneous magnetic field, which can be measured because of the high sensitivity of the sensor 22, is detected. Since this inhomogeneity is caused by the twisting, it is possible to eliminate the disturbance signal by calculation in that the individual signals from the sensors 22 which, by way of example, are arranged offset with respect to one another in the circumferential direction are suitably superimposed and are calculated together with one another.

Figure 4:
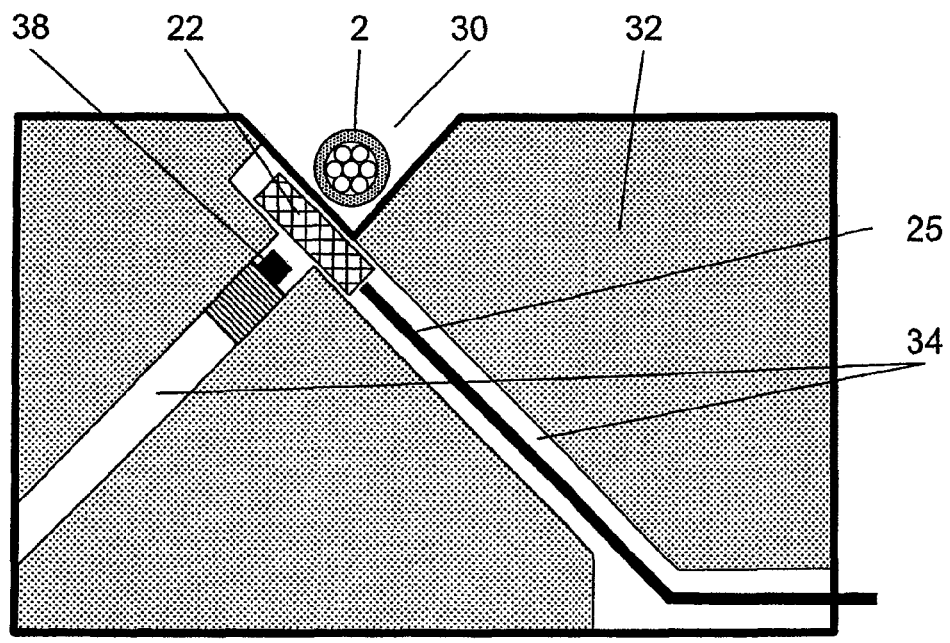
FIG. 4 is a diagrammatic, section view through a measurement configuration.

Finally, FIG. 4 also shows an exemplary embodiment of a measurement arrangement. In this case, the braided wire 4 is inserted into a type of V-groove 30 in a test block 32, and is drawn along the bottom of the V-groove 30 in the longitudinal direction. The sensor 22 is arranged at a discrete point in the V-groove 30. The braided wire 4 is therefore drawn over the sensor 22 at the discrete measurement point. If required, a further sensor 22, offset through 90°, can also be provided, as indicated by the dashed line. In this case, the sensor 22 is preferably also arranged offset with respect to the first sensor 22 in the axial direction. Two channels 34 extend from the V-groove 30, with one channel 34 being used to supply the signal line 25 to the sensor 22. A magnet, in particular a permanent magnet 38 is arranged in the other channel 34 and is used to set the operating point of the sensor 22. The braided wire 4 is preferably pressed against the sensor 22, in a manner which is not illustrated, in order to ensure a defined constant distance between the braided wire 4 and the sensor 22.

The invention claimed is:

1. A method for checking a current flow through individual wires of a braided wire, the individual wires being twisted with one another with a lay length, which comprises the steps of:
   passing an electric current through the braided wire;
   detecting a magnetic field being formed as a result of the braided wire through which the electric current flows via a sensor; and
   evaluating the magnetic field and deducing a fault location if a measured magnetic field has a characteristic oscillation having a length being a multiple of the lay length and in particular corresponds to the lay length.

2. The method according to claim 1, which further comprises:
   checking a quality of a contact connection of a contact element to the braided wire, with the braided wire containing a plurality of the individual wires which are twisted with one another with the lay length, in that the electric current is passed through the braided wire, with the magnetic field which is formed as a result of the braided wire through which current flows being detected by the sensor at a distance from the contact connection;
   evaluating the magnetic field; and
   deducing the fault location at the contact connection on a basis of the magnetic field which is measured at the distance from the contact connection.

3. The method according to claim 1, which further comprises evaluating the magnetic field at a distance from the fault location, seen in a longitudinal direction of the braided wire, and the fault location is deduced.

4. The method according to claim 3, which further comprises setting the distance from the fault location in a range from 2 to 10 times the lay length.

5. The method according to claim 1, wherein a characteristic oscillation indicates spatial propagation and a spatial center of propagation is localized as the fault location in the braided wire.

6. The method according to claim 1, which further comprises detecting a gradient of the magnetic field.

7. The method according to claim 6, which further comprises detecting the gradient of the magnetic field with an aid of a gradiometer as the sensor.

8. The method according to claim 1, which further comprises detecting the magnetic field using only one sensor.

9. The method according to claim 1, which further comprises detecting the magnetic field with an aid of a plurality of sensors which are offset with respect to one another in a circumferential direction of the braided wire.

10. The method according to claim 9, which further comprises forming a target signal by calculation from individual signals which are produced via the sensors, in which target signal disturbance effects which are not caused at the fault location are filtered out.

11. The method according to claim 1, which further comprises applying a direct current to the braided wire.

12. The method according to claim 11, which further comprises modulating an alternating-current component onto the direct current.

13. The method according to claim 1, which further comprises moving the braided wire such that the magnetic field is varied.

14. The method according to claim 1, which further comprises forming the braided wire as an electrical cable.

15. The method according to claim 1, which further comprises forming the braided wire as a mechanical supporting cable.

16. The method according to claim 1, which further comprises exerting a force on the braided wire such that the magnetic field is varied.

17. An apparatus, comprising:
   a current source for feeding an electric current into a braided wire, with the braided wire having a plurality of individual wires being twisted with one another with a lay length;
   a sensor for detecting a magnetic field formed as a result of the braided wire through which the electric current flows; and
   an evaluation unit coupled to said sensor for evaluating the magnetic field detected by the sensor, said evaluation unit being designed such that a fault location is deduced if a measured magnetic field has an oscillation whose length being a multiple of the lay length, and in particular corresponds to the lay length.

* * * * *